(12) United States Patent
Wargo

(10) Patent No.: US 10,153,535 B2
(45) Date of Patent: Dec. 11, 2018

(54) BOND CHANNEL RELIEFS FOR BONDED ASSEMBLIES AND RELATED TECHNIQUES

(71) Applicant: Raytheon Company, Waltham, MA (US)

(72) Inventor: Matthew J. Wargo, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 129 days.

(21) Appl. No.: 15/270,593

(22) Filed: Sep. 20, 2016

(65) Prior Publication Data

US 2018/0083333 A1    Mar. 22, 2018

(51) Int. Cl.

| H01P 3/08 | (2006.01) |
|---|---|
| H01P 11/00 | (2006.01) |
| H05K 1/02 | (2006.01) |
| F16B 11/00 | (2006.01) |
| H01Q 21/06 | (2006.01) |
| H01Q 23/00 | (2006.01) |

(52) U.S. Cl.
CPC ............ *H01P 3/087* (2013.01); *F16B 11/006* (2013.01); *H01P 3/081* (2013.01); *H01P 11/003* (2013.01); *H01Q 21/064* (2013.01); *H01Q 23/00* (2013.01); *H05K 1/0242* (2013.01)

(58) Field of Classification Search
CPC .......... F16B 11/006; H01P 3/08; H01P 3/081; H01P 3/082; H01P 3/084; H01P 3/085; H01P 3/087; H01P 11/003; H05K 1/0237; H05K 1/0242; H01Q 1/38; H01Q 9/0407; H01Q 23/00; H01Q 21/064
USPC ........................ 333/204, 205, 236, 238, 246; 343/700 MS; 156/47, 48
See application file for complete search history.

(56) References Cited

U.S. PATENT DOCUMENTS

| 3,863,181 A | 1/1975 | Glance et al. |
|---|---|---|
| 5,239,131 A | 8/1993 | Hoffman et al. |
| 6,052,889 A | 4/2000 | Yu et al. |
| 6,102,306 A | 8/2000 | Ask et al. |
| 6,622,370 B1 | 9/2003 | Sherman et al. |
| 7,368,391 B2 | 5/2008 | Tan et al. |

(Continued)

FOREIGN PATENT DOCUMENTS

KR    2016-0104125    9/2016

OTHER PUBLICATIONS

Chuang, et al.; "Development and Qualification of a Mechanical-Optical Interface for Parallel Optics Links;" Photonics West Optical Interconnects XV; Proc. SPIE vol. 9368; Apr. 3, 2015; 8 pages.

(Continued)

*Primary Examiner* — Rakesh Patel
*Assistant Examiner* — Jorge Salazar, Jr.
(74) *Attorney, Agent, or Firm* — Daly, Crowley, Mofford & Durkee

(57) ABSTRACT

A flat plate assembly is provided from at least a pair of plates with at least one surface of one plate have one or more relief channels provided therein around epoxy bonded signal channels. The relief channels are provided having a size and shape selected to control the flow of a liquid bonding adhesive. Adhesive location can thus be controlled through geometry of the relief channels rather than through process controls. Thus, this approach reduces dependence on adhesive process control, reduces wicking of adhesive into signal channels and reduces the number of voids in a bond line of a bonded flat plate assembly.

20 Claims, 6 Drawing Sheets

(56) References Cited

U.S. PATENT DOCUMENTS

| | | |
|---|---|---|
| 8,734,604 B2 | 5/2014 | Anderson et al. |
| 9,029,991 B2 | 5/2015 | Warren et al. |
| 2004/0048420 A1 | 3/2004 | Miller |
| 2013/0341967 A1 | 12/2013 | Greve |
| 2014/0246148 A1 | 9/2014 | Liu et al. |

OTHER PUBLICATIONS

Wu, et al.; "Modular Integration of Electronics and Microfluidic Systems Using Flexible Printed Circuit Boards;" Lab Chip 2010; Feb. 21, 2010; pp. 519-521; 3 pages.

PCT Search Report of the ISA for PCT Appl. No. PCT/US2017/024700 dated Jun. 21, 2017; 6 pages.

PCT Written Opinion of the ISA for PCT Appl. No. PCT/US2017/024700 dated Jun. 21, 2017; 8 pages.

BOND CHANNEL RELIEFS FOR BONDED ASSEMBLIES AND RELATED TECHNIQUES

STATEMENT REGARDING FEDERALLY SPONSORED RESEARCH

This invention was made with Government support under Contract No. N00024-15-C-5420 awarded by the Department of Defense. The Government has certain rights in the invention.

BACKGROUND

As is known in the art, there exists a class of circuits referred to as "flat plate assemblies." In general, flat plate assemblies are comprised of two or more plate-like structures bonded together. So-called "flat-plate antennas" and other radio frequency (RF) flat plate assemblies are provided from electronically conductive plates having flat surfaces with printed circuit boards (PCBs) disposed therebetween. The plates in such assemblies are often bonded using an adhesive such as a conductive epoxy. One important factor to consider when bonding plates is a thickness of a line of adhesive disposed between the plates (also referred to as a bond line). If an inadequate bond line is used, the plates are not securely bonded together. Thus, the risks of an inadequate bond line include, but are not limited to, low connection strength, poor electrical properties and high thermal resistance between the plates.

Bond line thickness is difficult to control during process and manufacturing cycles. Attempts to control the volume and location of conductive epoxies or other adhesives used for bonding plates together have been process-focused. For example, automated dispense equipment and volumetric statistical process control (SPC) measurements have been used to help control an amount and location of a dispensed epoxy or adhesive. Even with such controls, however, during a cure part of a bonding process, capillary action may cause an adhesive to wick out of a bond channel between flat surfaces of the plates being bonded. This can result in voids in the bond and/or the existence of adhesive in an RF signal path (e.g. due to having an excess amount of adhesive forced into the RF signal path when plates are secured together). A void in an epoxy bondline and/or the existence of a conductive adhesive in an RF signal path can result in degradation of electrical and/or mechanical performance characteristics of the flat plate assembly.

This problem has been controlled to some degree by fabricating or otherwise providing so-called "adhesive lines" on flat areas of plates to be bonded. Such adhesive lines act as dams intended to prevent wicking of the bond material. This approach, however, is time consuming and often requires multiple iterations to arrive at a reasonable configuration of adhesive lines. Additionally, when bonding plates, cure operations are "blind" so the results can only be inspected after bonding the plates. Thus, insufficient bonds are often only discovered after undertaking the time and expense of manufacturing the flat plate assembly.

SUMMARY

In accordance with one aspect of the concepts, circuits and techniques described herein, a flat plate assembly includes a pair of plates, each having first and second opposing surfaces; a signal path provided in at least one surface of at least one of the plates; a bond channel provided in at least one surface of at least one of the plates proximate at least a portion of the signal path; and a relief channel provided in at least one surface of at least one of the plates.

With this particular arrangement, a flat plate assembly is provided having a design feature (i.e. a relief channel) which reduces process variability and controls location of a conductive adhesive in a blind cure. The relief channel is disposed around and spaced apart from a perimeter of the bond channel and is provided having an aspect ratio and having a shape which defines one or more wick regions such that in response to an adhesive disposed in the bond channel and pressure applied to the plates, the relief channel causes the adhesive to wick to a surface of said plates in the one or more wick regions. This reduces the occurrence of voids in a bond line and reduces the amount of adhesive which may be forced into the signal path.

The flat plate assembly may include one or more of the following features independently or in combination with another feature to include: wick regions corresponding to portions of a surface of at least one of said plates between said bond channel and said relief channel; at least some of relief channels and bond channels provided in the same surface of one of the plates; relief channels and bond channels are disposed around a perimeter of the signal path; the signal path is a first one of a plurality of signal paths and at least one of the plurality of signal paths comprises at least one channel in at least one surface of at least one of the pair of plates; at least one of the plurality of signal paths is an RF signal path; at least one of a plurality of signal paths is a suspended air stripline (SAS) signal path; the bond channel is disposed proximate at least a portion of an SAS signal path; the relief channel is disposed proximate at least a portion of a bond channel; a suspended air stripline (SAS) signal path comprises one or more channels provided in a first surface of a first one of the pair of plates and one or more matching channels in a first surface of a second one of the pair of plates and a printed circuit board disposed substantially between the channels; the bond channel is provided in the same surface as one of the channels which form the SAS signal path and proximate the channel; and the relief channel is provided in the same surface as the bond channel proximate at least a portion of the bond channel.

In accordance a further aspect of the concepts, circuits and techniques described herein, a radio frequency (RF) assembly includes first and second conductive plates with a first one of the plates having RF and bond channels provided in a first surface thereof. A relief channel is also disposed in the first surface proximate the bond channel with the relief channel being spaced apart from the bond channel with the dimensions and spacing of the relief channel selected to control capillary forces which may otherwise cause an adhesive (e.g. an electrically conductive epoxy adhesive) to wick toward (or even into) the RF channel.

In one aspect, the relief channel is provided having dimensions and a shape selected such that the available area where capillary action can cause an adhesive to wick can be controlled to any desired shape.

The relief channels performed the desired function: (1) control location of adhesive and prevent wicking; (2) little or no voiding present, even though dispense was manual; and (3) reduces manufacturing variability.

With this particular arrangement a radio frequency (RF) assembly includes a relief channel feature which reduces, and ideally eliminates, variability in a bond process thereby making the bond process more controllable than prior art bonding techniques. In particular, by adding a relief channel around the bond channel, the amount and location of adhesive wicking can be controlled to reduce and ideally prevent voiding in a bond line. The relief channel also reduces and ideally prevents the adhesive from being directed (e.g. squeezed or otherwise directed) from the bond channel into the RF channel. Since bond line voiding and RF channel contaminants may both cause performance degradation, by reducing (and ideally preventing) voiding in the bond line and reducing (and ideally preventing) adhesive from being directed from the bond channel into the RF channel, circuit performance is improved.

The adhesive will only be able to wick between thin gaps (e.g. only where the flat surfaces of the plates come together). By adding a relief channel some distance from the bond line, the available area where capillary action can cause the adhesive to wick can be controlled to any desired region or shape. Because the adhesive will follow (e.g. flow) only these areas, the criticality of the location and volume of the dispensed bead are reduced allowing for more acceptable process variability without impacting performance variability.

With this particular arrangement, an RF assembly is provided having a design feature (i.e. a relief channel) which reduces process variability, controls location of conductive adhesive in a blind cure and provides the assembly having a wider range of variability between epoxy voiding and squeezeout.

The concepts, structure and techniques described herein reduce the variability of performance due to process variability in the dispense of a bonding liquid. Thus, the described concepts, structure and techniques are useful for reducing performance variability in bonded RF assemblies or bonded electronic assemblies.

In accordance with a further aspect of the systems and techniques described herein, an electronic assembly includes first and second housings have at least one flat mating surface, a signal path provided in at least one surface of at least one of the housings, a bond channel provided in at least one surface of at least one of the housings and a relief channel provided in at least one surface of at least one of the housings, the relief channel disposed around and spaced apart from a perimeter of the bond channel and having an aspect ratio and a shape which defines one or more wick regions such that in response to an adhesive disposed in the bond channel and pressure applied to the housings, the relief channel causes the adhesive to wick to a surface of the housings in the one or more wick regions.

The electronic assembly, systems and techniques may also include one or more of the following features independently or in combination with another feature to include: the wick regions corresponding to portions of a surface of at least one of the housings between the bond channel and the relief channel; at least some of the relief and bond channels are provided in the same surface of one of the housings; the relief and bond channels are disposed around a perimeter of the signal path; the signal path is a first one of a plurality of signal paths and at least one of the of the signal paths includes at least one channel in at least one surface of at least one of the housings.

The addition of a simple machined geometry in strategically chosen size and location greatly reduces process variability. Thus, a low-cost, easy to implement design feature reduces such variability.

It should be appreciated that the circuits, systems and techniques described herein may include one or more of the above-mentioned features independently or in combination with another feature and that elements of different embodiments described herein may be combined to form other embodiments which may not be specifically set forth herein.

BRIEF DESCRIPTION OF THE DRAWINGS

The foregoing features may be more fully understood from the following description of the drawings in which.

DETAILED DESCRIPTION

Described herein are concepts, systems, circuits and related techniques for reducing, and ideally minimizing or eliminating, variability in a bond process by using one or more relief channels in a flat plate assembly.

Figure 1:
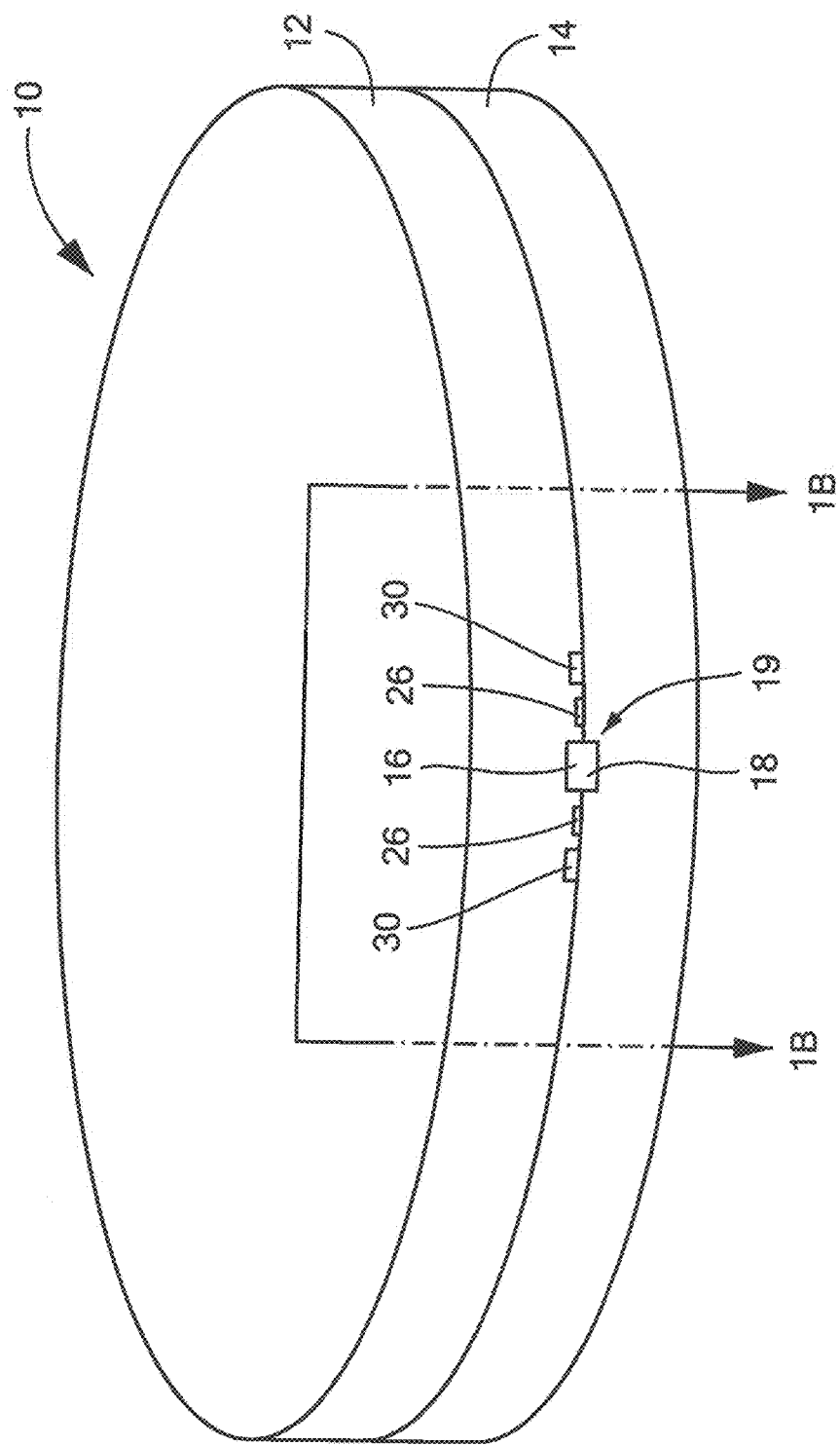
FIG. 1 is an isometric view of a flat plate assembly having relief channels provided therein.
Figure 1A:
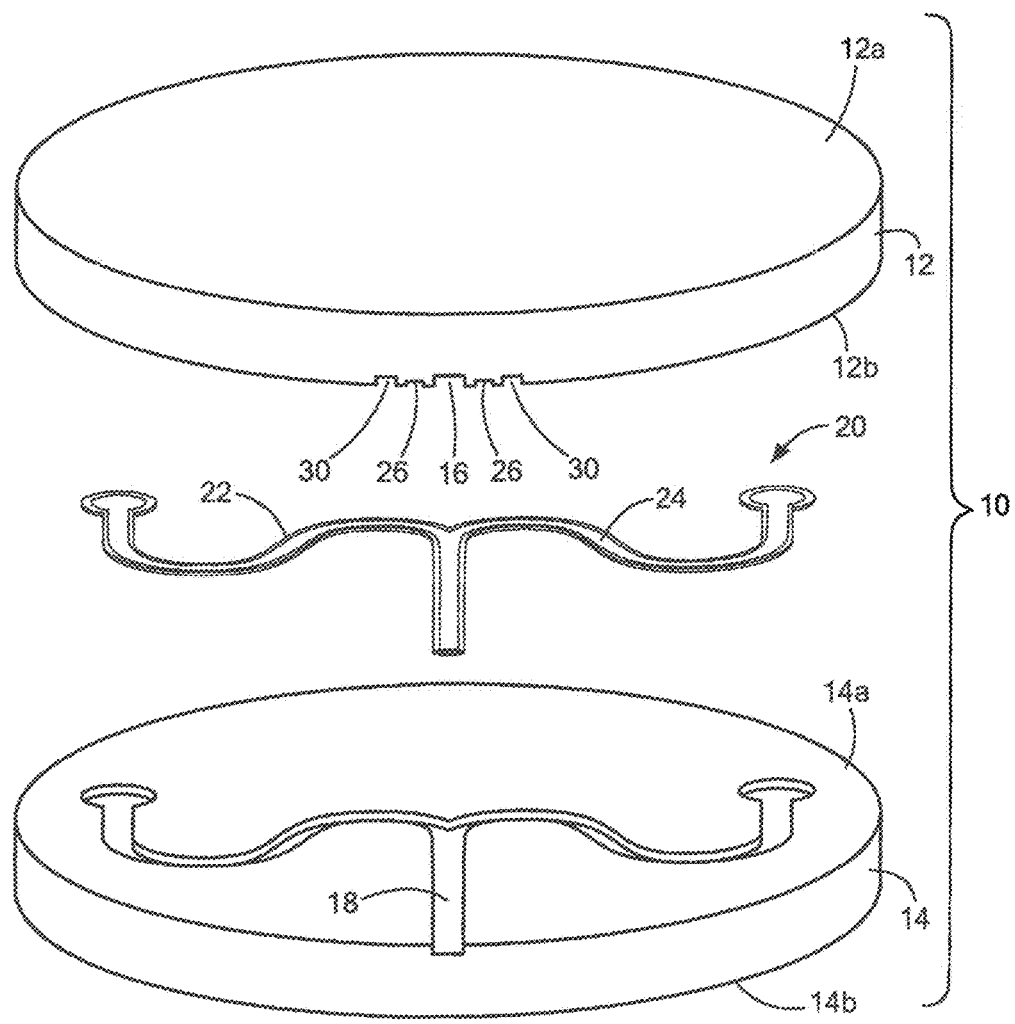
FIG. 1A is an exploded isometric view of the flat plate assembly of FIG. 1.
Figure 1B:
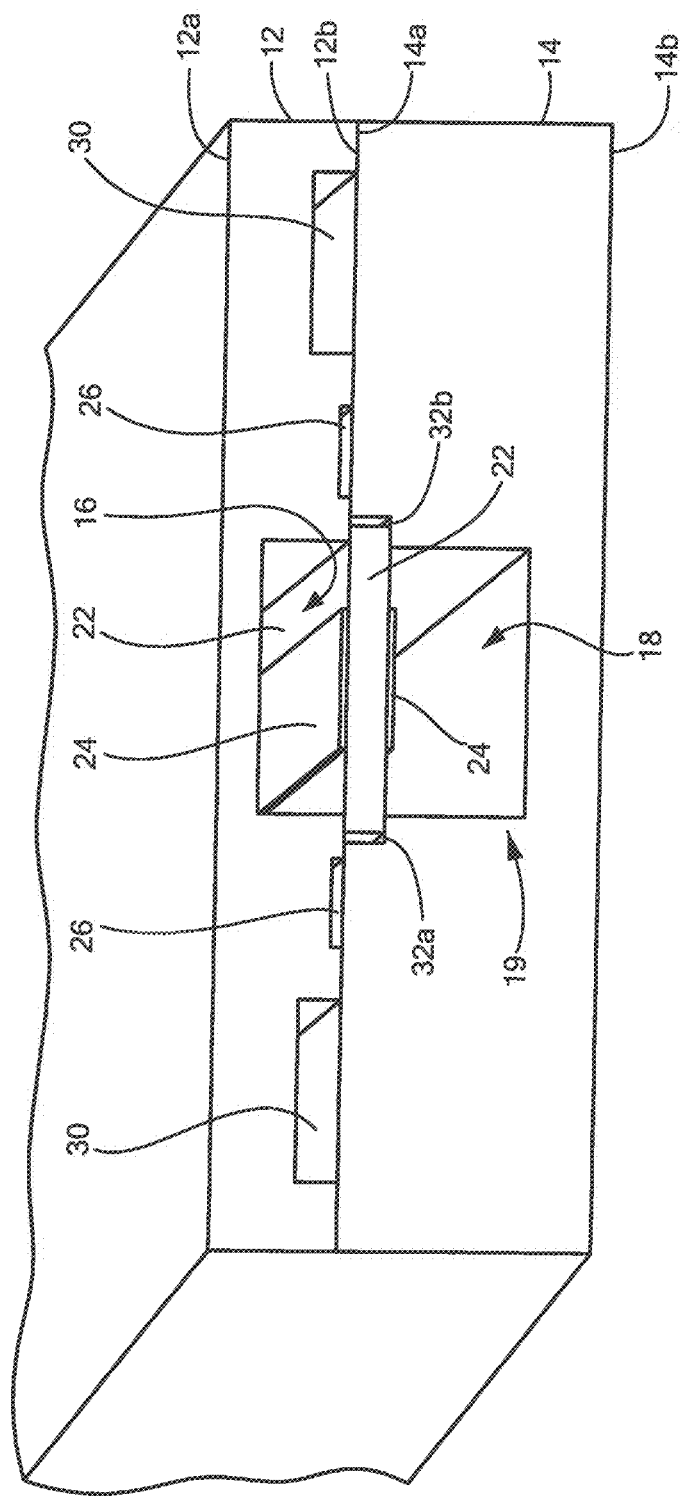
FIG. 1B is an isometric cross-sectional view of a portion of the flat plate assembly of FIG. 1 taken across lines 1B-1B.

Referring now to FIGS. 1, 1A and 1B in which like elements are provided having like reference designations throughout the several views, a flat plate assembly 10 includes a first plate 12 having first and second opposing surfaces 12a, 12b and a second plate 14 having first and second opposing surfaces 14a, 14b. Surfaces 12b and 14a each have respective ones of signal path portions 16, 18 formed or otherwise provided therein. Here, signal path portions are provided as open channels 16, 18 provided in plate surfaces 12b and 14a.

In this illustrative embodiment, channels 16, 18 are disposed on opposing plates such that when plate surfaces 12b, 14a are brought into contact (or substantially into contact), channels 16, 18 are aligned so as to form a closed channel 19. A printed circuit board (PCB) 20 comprising a substrate 22 having conductor 24 disposed is disposed in the channel 19 such that, channel 19, substrate 20 and conductors 22 form a suspended air stripline (SAS) transmission line along which signals (e.g. radio frequency (RF) signals may propagate.

It should be appreciated that although in this illustrative embodiment the signal paths are illustrated as RF signal paths (i.e. SAS transmission lines), after reading the disclosure of the concepts, circuit and techniques provided herein, those of ordinary skill in the art will understand that the disclosed concepts, structures and techniques may be used with any type of signal path including any type of RF or non-RF signal path. For example, in an RF signal path embodiment, the RF signal paths may be provided as any type of RF transmission line including, but not limited any type of waveguide transmission line, a slotline transmission line or any other type of transmission line or signal path (e.g. a channel, bore, groove, cavity chamber, duct or passage) in the assembly. In a non-RF signal path embodiment, a non-RF signal path may also comprise a channel, bore, groove, cavity chamber, duct and/or passage in the assembly through which signals propagate or through which signal lines pass.

Figure 1C:
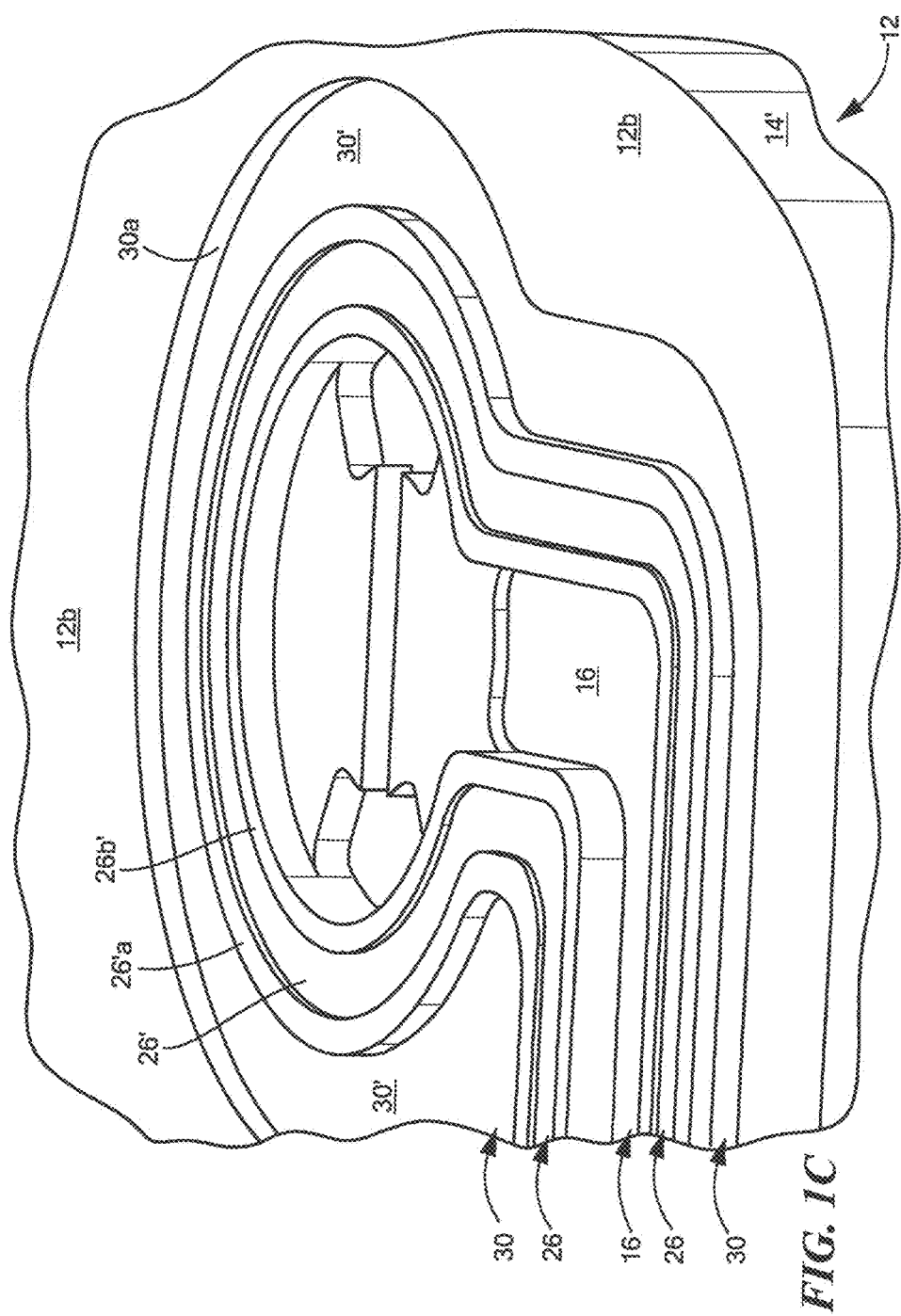
FIG. 1C is an isometric view of a portion of the flat plate assembly of FIGS. 1 and 1A having signal, bond and relief channels provided therein.

As may be most visible in FIGS. 1A-1C, surface 12a has a bond channel 26 provided therein proximate channel 16 and around a perimeter of at least a portion of the channel 16. The path of bond channel 26 may follow some or a portion of the channel path. Also provided in surface 12a are one or more relief channels 30.

As illustrated in FIG. 1C, the bond channel has a liquid adhesive 28 (e.g. a conductive epoxy) disposed therein which, after curing, secures together surfaces 12b, 14a once the first and second plates 12, 14 are mated or otherwise brought into contact with each other. As noted above, channel 18, which may be the same as or similar to channel 16) is provided in surface 14b of plate 14. It should be noted that one or more bond channels may optionally also be provided in surface 14a. Thus, at least one of the mating surfaces 12b, 14a is provided having a bond channel therein.

Relief channels 30 are disposed proximate some or all of the bond channel paths. The dimensions (i.e. width and depth) of the relief channel and spacing of the relief channel from the bond channel (e.g. either centerline-to-centerline spacing or edge-to-edge spacing) are selected to control capillary forces which may force or otherwise cause an adhesive (e.g. liquid adhesive 28) to wick toward (or even into) the RF signal path formed by channels 16, 18. Thus, the relief channel is provided having an aspect ratio which causes a fluid epoxy to travel in the bond channel and wick to a surface defined by the relief channel and outside of the signal path. The spacing of the relief channel from the bond channel may be selected using empirical techniques. It should, however, be appreciated that too shallow of a channel will not prevent wicking. The relief channel depth will vary depending upon the properties of the adhesive and may typically be determined empirically for each specific application. The width is usually limited by space constraints, but theoretically has no upper limit. The length of the relief channels is driven by the area to control. In some RF applications the goal maybe to have a complete seal around the RF channels in which case it is desirable for the bond reliefs to substantially follow the RF channels.

The adhesive will only be able to wick between very thin gaps, meaning only where flat surfaces of the plates 12, 14 come together. By adding a relief channel spaced apart from the bond line, the available area where capillary action can cause the adhesive to wick can be controlled to any desired region or shape (i.e. one or more relief channels are provided having dimensions and a shape selected such that the available area where capillary action can cause an adhesive to wick can be controlled to any desired shape). Because the adhesive will follow (e.g. substantially flow to) only the areas defined by the relief channel(s), the critically of the location and volume of the dispensed bead are reduced allowing for a wider range of process variability without any substantial impact on the mechanical and/or electrical performance of the assembly.

Thus, the relief channels function to: (1) control adhesive location; (3) reduce (and ideally eliminate) wicking of the adhesive into the RF channel; (2) reduce (and ideally eliminate) voiding in the bond line (even in cases of a manual adhesive dispense); and (3) reduce manufacturing variability.

As noted above, channels 16, 18 along with substrate 20 and conductors 22 form signal paths (here, RF transmission lines) which may be coupled together and/or which may provide different types of components (e.g. circuit components, such as various power splitters, couplers, circulators, and other RF components). The signal paths may also be used to couple together or provide different types of networks (e.g. corporate feed networks, distribution networks, beamformer networks, if applicable) or the signal paths may be used to couple together different types of components and/or networks. Because such structures are electromechanical structures, rather than discrete components, the physical dimensions, material properties, and assembly variation of the structures may be sources of performance variability for such components and/or networks. Thus, by controlling the flow of a bonding adhesive during a bonding process via the relief channels, variations caused by voids in a bond and/or variations caused by adhesive wicking into an RF channel are minimized and ideally eliminated.

Referring now to FIG. 1B, channel 18 has a pair of bosses 32a, 32b which support substrate 22 disposed in channel 19. The substrate 22 has a conductor 24 disposed on at least a first surface thereof. In some embodiments (and as most clearly shown in FIG. 1B) conductors 24 may be disposed on opposing surfaces of substrate 22. In some embodiments having conductors disposed on opposing surfaces of a substrate (as illustrated in FIG. 1B), the two conductors may be electrically coupled together using conductive via holes (not shown in FIG. 1B). The channel, substrate and conductors form a suspended-air-stripline (SAS) transmission line.

Bond channels 24 are provided having dimensions selected to receive an adhesive (e.g. a bonding adhesive such as a conductive, liquid epoxy). In this illustrative embodiment, bond channels 24 are provided in surface 12b of plate 12 although in other embodiments bond channels may be provided in surface 14a and in still other embodiments, bond channels may be provided in portions of both surfaces 12b, 14a (e.g. overlapping or non-overlapping portions).

As may also be clearly seen in FIG. 1B, an edge of each relief channel 30 is spaced a predetermined distance from an edge of bond channel 24. The relief channel is provided having dimensions selected to influence or control capillary forces exerted on any adhesive which overflows the bond channel in response to plate surfaces 12b, 14a being brought into close proximity and then into contact with each other. In this illustrative embodiment, relief channels 24 are provided in surface 12b of plate 12 although in other embodiments relief channels may be provided in surface 14a and in still other embodiments, relief channels may be provided in portions of both surfaces 12b, 14a (e.g. overlapping or non-overlapping portions) proximate bond channels. Thus, one or more relief channels are provided having an aspect ratio and a shape which defines one or more wick regions (i.e. regions where an adhesive is intended to wick) such that in response to an adhesive disposed in a bond channel and pressure applied to the plates to be bonded, the relief channel causes the adhesive to wick to a surface of the plates in the one or more wick regions (e.g. see regions 86, 88 in FIG. 3).

Figure 2:
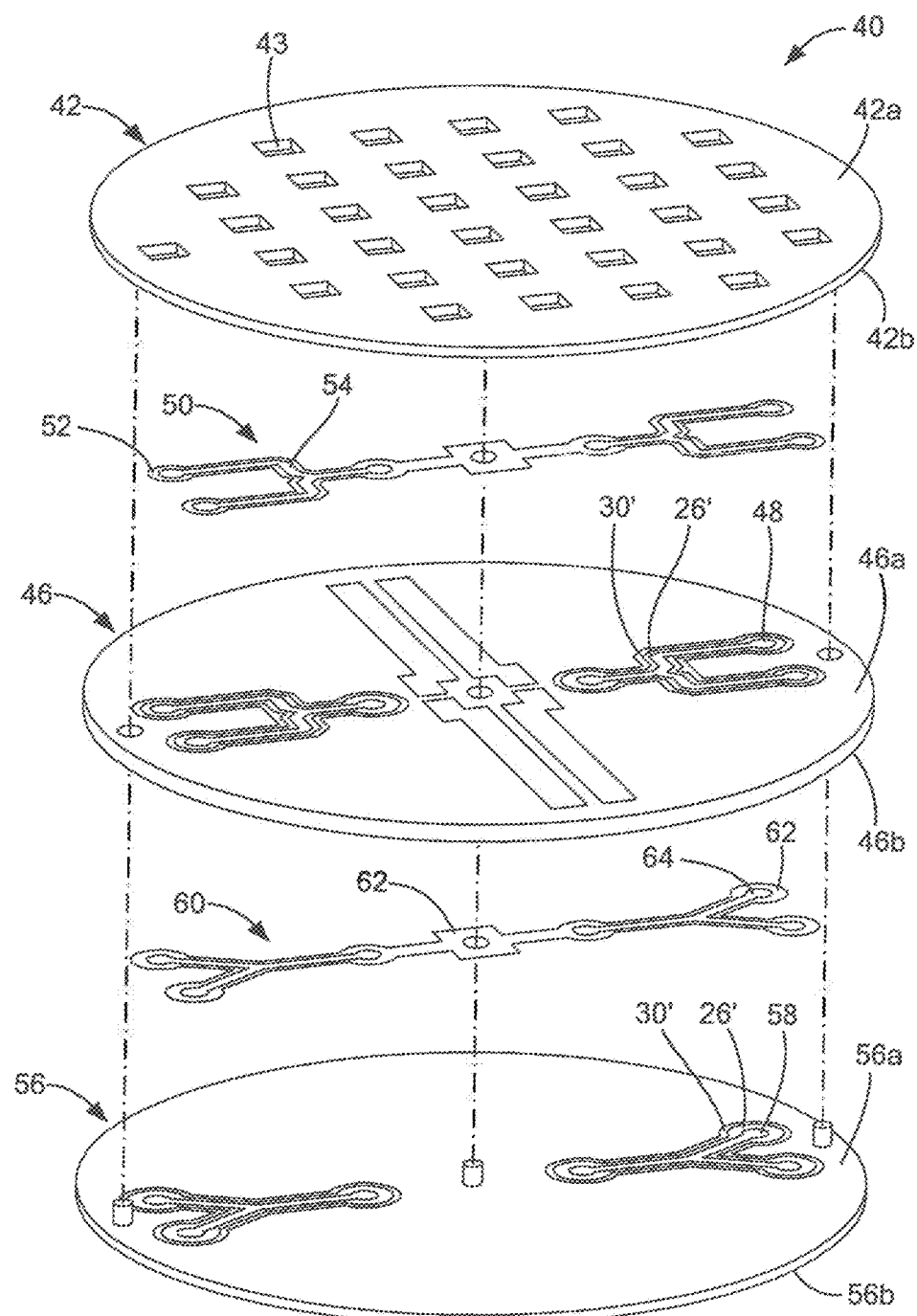
FIG. 2 is an exploded isometric view of a radio frequency (RF) flat plate antenna assembly having suspended-air-stripline transmission lines and relief channels provided therein.

Referring now to FIG. 2, a flat plate antenna assembly 40 includes a first plate 42 having first and second opposing surfaces 42a, 42b and a plurality (or array) of apertures 43 provided therein. Apertures 43 are each provided having a size and shape such that the apertures are responsive to RF signals having a frequency which fall within a desired operating frequency band of antenna assembly 40. Apertures 43 are also sometime referred to as antenna elements (or more simply "elements" or "radiators") and thus plate 42 may be referred to as an antenna or an aperture plate.

Antenna assembly 40 further includes a second conductive plate 46 having first and second opposing surfaces 46a, 46b and having channels 48 provided therein. Channels 48 may be the same as or similar to channels 16, 18 described above in conjunction with FIGS. 1, 1A 1B and 1C. Disposed between aperture plate surface 42b and surface 46a of plate 46 is a printed circuit board (PCB) 50 provided from a substrate 52 having conductive lines 54 (or more simply conductors 54) disposed thereover. A matching set of channels (not visible in FIG. 2) are provided in surface 42b. The width and shape of the channels in surface 42b substantially match the size and shape of the channel portions 48 in surface 46a. Plate 46 also has bond channels 26' and relief channels 30' provided therein. The bond and relief channels 26', 30' may be the same as or similar to bond and relief channels 26, 30 described above in conjunction with FIGS. 1-1C.

Conductors 54 on substrate 52 are patterned or otherwise provided such that when substrate 52 is properly disposed between surfaces 42b, 46a, substrate 52 and conductors 54 lie within channels 48 provided in plate surfaces 42b, 46a and the channels 48, substrate 52 and conductors 54 form a suspended air stripline (SAS) transmission line network (e.g. as shown in FIG. 1B) which is used to provide an antenna feed network.

It should be appreciated that to promote clarity in the drawings and written description, portions of the antenna feed network have been omitted. However, as will be appreciated by those of ordinary skill in the art, with a full feed network, RF signals may be coupled from the SAS transmission lines provided in plate 46 to the antenna elements 43 provided in antenna plate 42. Thus, plate 46 is sometimes referred to as an antenna feed plate.

Similarly, a third plate 56 having first and second opposing surfaces 56a, 56b has one or more channels 58 provided therein. A substantially matching set of channels (not visible in FIG. 2) are also provided in surface 46b. The width and shape of the channels in surface 46b substantially match the size and shape of the channels 58 in surface 56a. Plate 56 also has bond channels 26' and relief channels 30' provided therein. The bond and relief channels 26', 30' may be the same as or similar to bond and relief channels 26, 30 described above in conjunction with FIGS. 1, 1A, 1B and 1C.

A second printed circuit board 60 is disposed between plate surface 46b of plate 46 and surface 56a of plate 56. PCB 60 is provided from a substrate 62 having conductors 64 patterned or otherwise disposed on at least one surface thereof such that when substrate 62 is properly disposed between plate surfaces 46b and 56a, conductors 64 lie within the channels provided in plate surfaces 46b, 56a and the channels 58, substrate 62 and conductors 64 form an SAS signal path.

Disposed about the signal path are bond channels 26' and relief channels 30'. Thus, first and second plates 46, 56 each have provided therein one or more signal paths and one or more bond and relief channels 26', 30' disposed about the signal paths.

As with antenna feed plate 46, to promote clarity in the drawings, portions of the signal path channels and PCBs in plate 56 have been omitted. However, as will be appreciated by those of ordinary skill in the art, the full network or circuits and components on plate 56 enables the coupling of RF signals between the SAS transmission lines provided in plate 56 to the antenna elements 43 provided in antenna plate 42. Thus, plate 56 is also sometimes referred to as a feed plate.

It should be appreciated that in the illustrative embodiment of FIG. 2, relief channels 30' are illustrated as being disposed around the entire perimeters of signal channels 48, 58 and bond channels 26'. However, in other embodiments it may be desirable or preferred to provide relief channels 30' around only portions of the bond channels and/or signal paths. To determine location and path of the relief channels, a number of factors are considered, including but not limited to, the size, shape and complexity of the signal channels, the depth of the bond and relief channels, the spacing of the bond channels from the signal channels, the dimensions of the signal, bond and relief channels and the use of passthroughs where it is not desired to have adhesive or where particularly sensitive areas exist (where for example, a trace—e.g. a signal trace—passes close to a conductive surface—e.g. a wall—and it is desirable to prevent the trace from being coupled or "shorted" to ground (or to some other reference potential) due to an unintended conductive path provided by a conductive adhesive.

As explained above, the relief channels are spaced apart from the bond channel. The distance the relief channel is spaced from the bond channel as well as the relief channel dimensions are selected to control capillary forces which may otherwise cause an adhesive (e.g. an electrically conductive epoxy adhesive) to wick toward (or even into) the signal path provided between mating surfaces of the plates 42, 46, 56.

As also noted above, the relief channels functions to: (1) control adhesive location; (3) reduce (and ideally eliminate) wicking of the adhesive into the RF channel; (2) reduce (and ideally eliminate) voiding in the bond line (even with a manual adhesive dispense); and (3) reduce manufacturing variability. In one embodiment, one or more relief channels are provided having dimensions and a shape selected such that the available area where capillary action can cause an adhesive to wick can be controlled to any desired shape.

Thus, flat plate antenna assembly 40 includes a relief channel feature which reduces, and ideally eliminates, variability in a bond process thereby making the bond process more controllable than prior art bonding techniques. In particular, by adding a relief channel around the bond channel, the amount and location of adhesive wicking can be controlled to reduce and ideally prevent voiding in a bond line. The relief channel also reduces and ideally prevents adhesive from being directed (e.g. squeezed or otherwise directed) from the bond channel into the RF channel. Since bond line voiding and RF channel contaminants may both cause performance degradation, by reducing (and ideally preventing) voiding in the bond line and reducing (and ideally preventing) adhesive from being directed from the bond channel into the RF channel, circuit performance is improved.

As noted above, the adhesive will only be able to wick where flat surfaces of the plates come together. By adding a relief channel spaced apart from the bond line, the available area where capillary action can cause the adhesive to wick can be controlled to any desired region or shape. Because the adhesive will move to substantially these areas, a wider range of tolerances in process variability is acceptable without impacting electrical or mechanical performance.

Thus, an RF assembly is provided having a design feature (i.e. a relief channel machined or otherwise provided in a plate or housing around epoxy bonded RF channels) which controls location of conductive adhesive in a blind cure thereby reducing process variability and providing the assembly having a wider range of variability between epoxy voiding and squeeze-out.

In the illustrative embodiments of FIGS. 1, 1A, 1B and 1C and 2, the suspended air stripline (SAS) channel and relief geometry reduce (and ideally prevent) wicking of adhesive. Adhesive location can thus be controlled through geometry rather than through process. Accordingly, the concepts, structures and techniques described herein reduce dependence on process control.

Thus, inclusion of one or more relief channels in the surfaces to be bonded reduces the variability in circuit performance due to process variability in the dispense of a bonding liquid. Accordingly, inclusion of relief channels is useful to reduce performance variability in bonded RF and other assemblies.

In many instances, manufacturing know-how or trade secrets are used to reduce the number of bond voids which typically occur in a bonded flat pate assembly. By including relief channels as described herein, it is not necessary to share manufacturing know-how or trade secrets with third party manufacturers so as to reduce the number of bond voids which typically occur in a bonded flat pate assembly. Rather, the reliefs may be machined or otherwise provide in the assembly around epoxy bonded RF channels. The suspended air stripline (SAS) channel and relief geometry reduce (and ideally prevent) wicking of adhesive. Adhesive location can thus be controlled through geometry rather than through process. Thus, this approach reduces dependence on process control.

The concepts and techniques described herein are compatible with known process control methods including, but not limited to: statistical process control on adhesive volume per unit length; control and monitoring of temperature during cure; and pressure paper tests for checking proper contact during cure in press.

It should also be appreciated that the techniques described herein find application in a wide variety of areas including, but not limited to: manufacture of flat plate antennas; manufacture of bonded RF assemblies. It should thus be appreciated that the structures and techniques describe herein are not limited to use with RF assemblies. Rather, the structures and techniques describe herein may be used in a wide variety of different applications including but not limited to use with electronic assemblies having similar concerns with the flow of a conductive liquid or conductive adhesive.

Significantly, the "design" rather "process" nature of the concepts described herein result in application of the described structures and techniques to a wide variety of areas including, but not limited to, the design of RF circuits and systems.

Figure 3:
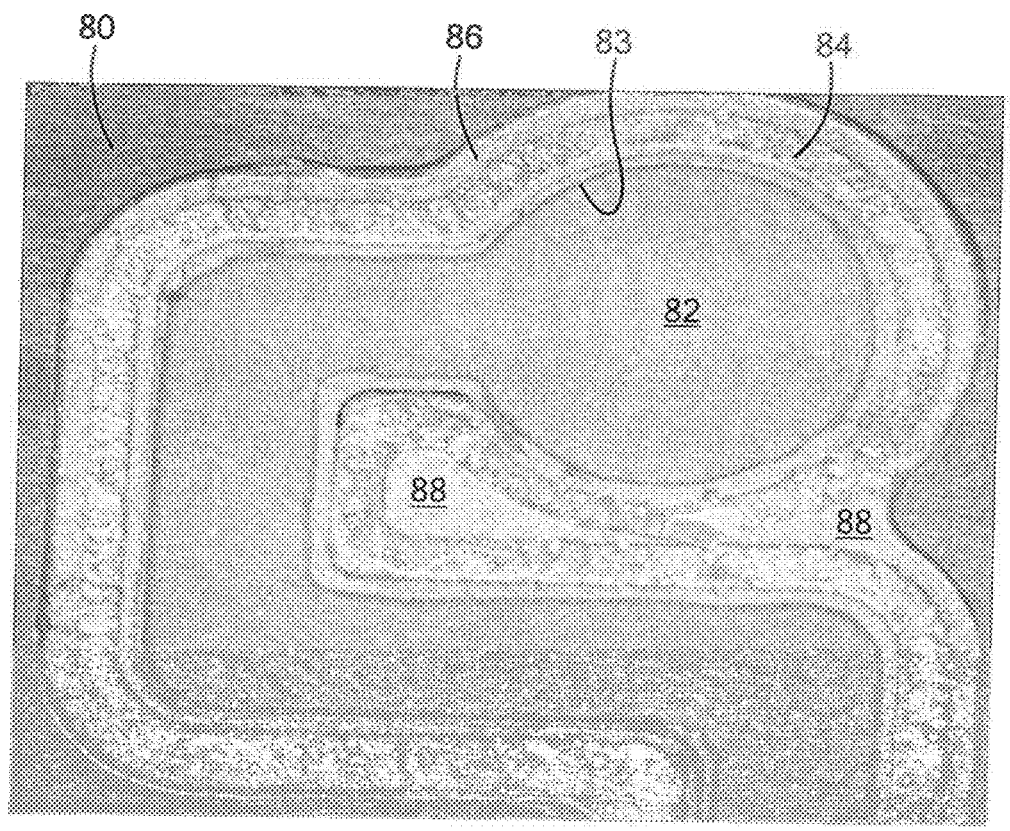
FIG. 3 is a top view of a sectioned flat plate assembly post-bond.

Referring now to FIG. 3, a portion of bonded assembly 80 which has been section post-bond reveals a portion of a signal path 82 defined by walls 83 and having a bond line 84. It should be noted that wicking is limited to regions 86, 88 (so-called wick regions) where no relief channel has been provided.

Since the adhesive will only be able to wick between very thin gaps (e.g. only where the flat surfaces of the plates come together), adding a relief channel spaced apart from the bond line defines an available area where capillary action can cause the adhesive to wick. Thus relief channels can be use to define or control wicking to any desired region or shape (here regions 86, 88). Because the adhesive will follow (e.g. flow) to only these areas, the criticality of the location and volume of a dispensed adhesive (e.g a dispensed bead) is reduced allowing for a wider range of process variability without adversely impacting performance of a circuit, network or assembly. Thus, the relief channel is provided having an aspect ratio and a shape which defines one or more wick regions such that in response to an adhesive disposed in a bond channel and pressure applied to the plates to be bonded, the relief channel causes the adhesive to wick to a surface of the plates in the one or more wick regions.

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, some of the presented implementation examples show a system with an SAS transmission line implementation. It will be appreciated that the concepts described herein can be used using RF systems implemented using in other than SAS transmission lines. Other combination or modifications are also possible all of which will be readily apparent to one of ordinary skill in the art after reading the disclosure provided herein.

Having described preferred embodiments which serve to illustrate various concepts, systems circuits and techniques, which are the subject of this patent, it will now become apparent to those of ordinary skill in the art that other embodiments incorporating these concepts, systems circuits and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents.

It should thus be appreciated that elements of different embodiments described herein may be combined to form other embodiments which may not be specifically set forth herein. Various elements, which are described in the context of a single embodiment, may also be provided separately or in any suitable subcombination. Other embodiments not specifically described herein are also within the scope of the following claims.

It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

What is claimed is:

1. A flat plate assembly comprising:
   a pair of plates, each plate having first and second opposing surfaces;
   one or more signal paths provided in at least one surface of at least one of said plates;
   one or more bond channels provided in the at least one surface of at least one of said plates proximate at least a portion of said signal paths; and
   one or more relief channels provided in the at least one surface of at least one of said plates, wherein at least one of said relief channels is disposed around and spaced apart from a perimeter of said bond channels, the at least one of said relief channels and a shape which defines one or more wick regions such that in response to an adhesive disposed in at least one of said bond channels and pressure applied to said please causes the adhesive to wick to a surface of said plates in the one or more wick regions.

2. The flat plate assembly of claim 1 wherein the one or more wick regions correspond to portions of the at least one surface of at least one of said plates between said bond channels and said relief channels.

3. The flat plate assembly of claim 1 wherein at least one or more of said relief channels and said bond channels are provided in the same surface of one of said plates.

4. The flat plate assembly of claim 1 wherein the at least one of said relief channels and at least one of said bond channels are disposed around a perimeter of the at least one of said signal paths.

5. The flat plate assembly of claim 4 wherein the at least one of said signal paths comprises at least one channel in the at least one surface of at least one of said plates.

6. The flat plate assembly of claim 5 wherein the at least one of said signal paths is an RF signal path.

7. The flat plate assembly of claim 6 wherein:
the at least one of said signal paths is a suspended air stripline (SAS) signal path;
the at least one of said bond channels is disposed proximate at least a portion of said SAS signal path; and
the at least one of said relief channels is disposed proximate at least a portion of at least one of said bond channels.

8. The flat plate assembly of claim 7 wherein:
said suspended air stripline (SAS) signal path comprises one or more channels provided in a first surface of a first one of said pair of plates; one or more matching channels in a first surface of a second one of said pair of plates and a printed circuit board disposed substantially between the one or more channels;
the at least one of said bond channels is provided in the same surface as one of the channels of said of the SAS signal path and proximate the channel; and
the at least one of said relief channels is provided in the same surface as the at least one of the bond channels proximate at least a portion of the at least one of said bond channels.

9. A method of bonding first and second conductive plates to provide a bonded assembly, the method comprising:
a) providing a signal path in a first one of the first and second plates;
b) providing a bond channel in the first one of the first and second plates, said bond channel proximate at least a portion of said signal path;
c) providing a relief channel in the second one of the first and second plates, said relief channel proximate at least a portion of said bond channel;
d) disposing an epoxy in said bond channel; and
e) mating the first plate to the second plate to provide the bonded assembly.

10. The method of claim 9 wherein providing the signal path in the first one of the first and second plates comprises providing a radio frequency (RF) signal path in a first one of the first and second plates.

11. The method of claim 10 wherein providing the relief channel in the second one of the first and second plates, comprises providing the relief channel having an aspect ratio which causes a fluid epoxy to travel in said bond channel and wick to a surface defined by the relief channel and outside of the signal path in response to mating the first plate to the second plate.

12. The method of claim 11 wherein providing the RF signal path in a first one of the first and second plates comprises:
providing a suspended air stripline (SAS) signal path in the first one of the first and second plates;
providing the bond channel in the first one of the first and second plates comprises providing the bond channel proximate at least a portion of said of the SAS signal path; and
providing the relief channel in the second one of the first and second plates comprises providing the relief channel proximate at least a portion of said bond channel.

13. An electronic assembly comprising:
first and second housings have at least one flat mating surface;
one or more signal paths provided in at least one surface of at least one of said first and second housings;
one or more bond channels provided in the at least one surface of at least one of said first and second housings proximate at least a portion of said signal paths; and
one or more relief channels provided in the at least one surface of at least one of said first and second housings, wherein at least one of said relief channels is disposed around and spaced apart from a perimeter of said bond channels, the at least one of said relief channels and a shape which defines one or more wick regions such that in response to an adhesive disposed in said bond channels and pressure applied to one of said first and second housings, and causes the adhesive to wick to a surface of said first and second housings in the one or more wick regions.

14. The electronic assembly of claim 13 wherein the one or more wick regions correspond to portions of the at least one surface of at least one of said first and second housings between said bond channels and said relief channels.

15. The electronic assembly of claim 13 wherein at least some of said relief channels and said bond channels are provided in the same surface of one of said first and second housings.

16. The electronic assembly of claim 13 wherein the at least one of said relief channels and the at least one of said bond channels are disposed around a perimeter of at least one of said signal paths.

17. The electronic assembly of claim 16 wherein the at least one of said signal paths comprises at least one channel in the at least one surface of at least one of said first and second housings.

18. A radio frequency (RF) flat plate assembly comprising:
a pair of conductive plates, each plate having first and second opposing surfaces;
one or more signal paths provided in at least one surface of at least one of said conductive plates;
one or more bond channels provided in the at least one surface of at least one of said conductive plates proximate an entire perimeter of said at least one signal path; and
one or more relief channels provided in the at least one surface of at least one of said conductive plates, wherein at least one of said relief channels is disposed around and spaced apart from an entire perimeter of said bond channels, the at least one of said relief channels and a shape which defines one or more wick regions such that in response to an adhesive disposed in said bond channels and pressure applied to said please causes the adhesive to wick to a surface of said plates in the one or more wick regions wherein: the one or more wick regions correspond to portions of the at least one surface of at least one of said conductive plates between each said bond channels and said relief channels; and at least some of said relief channels and said bond channels are provided in the same surface of one of said plates.

19. The flat plate assembly of claim 18 wherein:

at least one of said signal paths comprises at least one channel in at least one surface of at least one of said plates;

at least one of said signal paths is a suspended air stripline (SAS) signal path;

at least one of said bond channels is disposed proximate at least a portion of said SAS signal path; and at least one of said relief channels is disposed proximate at least a portion of the at least one of said bond channels.

20. The flat plate assembly of claim 19 wherein:

said suspended air stripline (SAS) signal path comprises one or more channels provided in a first surface of a first one of said pair of plates; one or more matching channels in a first surface of a second one of said pair of plates and a printed circuit board disposed substantially between the one or more channels;

the at least one of said bond channels is provided in the same surface as one of the channels of said of the SAS signal path and proximate the channel; and the at least one of said relief channels is provided in the same surface as the at least one of the bond channels proximate at least a portion of the at least one of said bond channels.

* * * * *